United States Patent
Liu et al.

(10) Patent No.: US 6,869,844 B1
(45) Date of Patent: Mar. 22, 2005

(54) METHOD AND STRUCTURE FOR PROTECTING NROM DEVICES FROM INDUCED CHARGE DAMAGE DURING DEVICE FABRICATION

(75) Inventors: Zhizheng Liu, Sunnyvale, CA (US); Yider Wu, Campbell, CA (US); Jean Yee-Mei Yang, Sunnyvale, CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 0 days.

(21) Appl. No.: 10/701,780

(22) Filed: Nov. 5, 2003

(51) Int. Cl.[7] ............................................. H01L 21/336
(52) U.S. Cl. ................. 438/264; 438/263; 438/216; 438/287; 438/288; 438/258; 257/324; 257/173; 257/E21.423; 257/E29.309; 257/E25.024; 257/355
(58) Field of Search ................. 438/264, 263, 438/216, 287, 288, 258; 257/324, 173, E21.423, E21.309, E25.024, 355

(56) References Cited

U.S. PATENT DOCUMENTS

| | | | | |
|---|---|---|---|---|
| 5,168,334 A | | 12/1992 | Mitchell et al. ............ 257/324 |
| 5,466,622 A | * | 11/1995 | Cappelletti ................. 438/258 |
| 5,768,192 A | * | 6/1998 | Eitan ...................... 365/185.24 |
| 6,297,096 B1 | * | 10/2001 | Boaz ......................... 438/261 |
| 6,348,381 B1 | * | 2/2002 | Jong et al. .................. 438/258 |
| 6,417,053 B1 | * | 7/2002 | Kuo ........................... 438/287 |
| 6,420,223 B2 | * | 7/2002 | Camerlenghi ............... 438/211 |
| 6,545,309 B1 | * | 4/2003 | Kuo ........................... 257/302 |
| 6,642,113 B1 | * | 11/2003 | Kuo et al. .................. 438/275 |
| 6,680,227 B2 | * | 1/2004 | Kuo et al. .................. 438/215 |
| 2001/0026970 A1 | * | 10/2001 | Eitan et al. ................. 438/215 |
| 2002/0055230 A1 | * | 5/2002 | Chang ........................ 438/258 |
| 2003/0096476 A1 | * | 5/2003 | Bloom et al. ............... 438/257 |
| 2003/0168701 A1 | * | 9/2003 | Voldman .................... 257/355 |
| 2003/0178664 A1 | * | 9/2003 | Kuo et al. .................. 257/306 |
| 2003/0194842 A1 | * | 10/2003 | Kuo et al. .................. 438/258 |
| 2004/0026732 A1 | * | 2/2004 | Kuo et al. .................. 257/314 |
| 2004/0121542 A1 | * | 6/2004 | Chang ........................ 438/261 |

\* cited by examiner

Primary Examiner—Matthew Smith
Assistant Examiner—B. V. Keshavan
(74) Attorney, Agent, or Firm—Winstead Sechrest & Minick P.C.

(57) ABSTRACT

A structure for protecting an NROM from induced charge damage during device fabrication is described. The structure provides a discharge path for charge accumulated on the polygate layer during fabrication while providing sufficient isolation to ensure normal circuit operation.

20 Claims, 2 Drawing Sheets

US 6,869,844 B1

METHOD AND STRUCTURE FOR PROTECTING NROM DEVICES FROM INDUCED CHARGE DAMAGE DURING DEVICE FABRICATION

FIELD OF THE INVENTION

The present invention relates to NROM devices, and more particularly to protecting such devices against induced charge damage during fabrication.

BACKGROUND OF THE INVENTION

Flash memory is commonly employed in computer and microprocessor systems as electrically erasable programmable read-only memory (EEPROM) for the non-volatile storage of data. A common structure for flash memory devices is an array of memory cells comprising silicon nitride as a charge-trapping layer within a stacked gate structure formed as a silicon oxide/silicon nitride/silicon oxide (ONO) structure. The name silicon nitride read-only memory or NROM generally refers to such memory devices.

The stacked gate structure includes the ONO structure fabricated on a semiconductor substrate between source and drain regions implanted therein. A control gate is deposited on top of the gate stack. The silicon nitride charge trapping layer is insulated from the semiconductor substrate, the source and drain implants, and the control gate by the silicon oxide in the ONO layer.

Through appropriate biasing of the control gate, the source, and the drain of a memory cell, charge may be injected into or removed from the charge-trapping layer. A memory cell may be read by appropriately biasing the cell to determine the presence or absence of a trapped charge. The presence or absence of a charge represents a logic value stored in the flash memory cell.

Leakage current, e.g., the leakage of injected charge from the charge trapping layer, is a significant factor in determining how long data is retained in an NROM memory cell. At small memory cell sizes, leakage current is often a design limiting parameter. For example, a minimum silicon oxide layer thickness in the ONO layer may be needed to keep leakage current low enough to provide a desired data retention lifetime.

Defects in the insulating oxide layers of a stacked gate structure have an adverse effect on leakage current. A significant cause of damage to the insulating oxide layers is the presence of excessive tunneling currents during device fabrication. After a stacked gate is formed additional processing steps are performed to finish fabrication. For example additional masking and etching may be required to form additional semiconductor structures or to deposit metal or polysilicon interconnects on a semiconductor device. When a device is exposed to plasma processing, e.g., plasma etching, electrical charges may accumulate on the interconnects due to a phenomenon referred to as the 'antenna effect.' The accumulated charge on the interconnects creates a voltage difference across the ONO layer of a NROM memory cell. A sufficiently large voltage difference may cause tunneling current to flow through the ONO layer introducing a programming effect and altering the threshold voltage of the memory cell. In addition, large induced tunneling currents may damage the insulating oxides in the stacked gate, causing a decrease in insulation and resulting in increased leakage currents in the memory cells.

Accordingly, a need exists to protect flash memory cells, and NROM memory cells in particular, from induced charge damage during fabrication. The present invention addresses such a need.

SUMMARY OF THE INVENTION

Methods for protecting memory cells from damage induced during device fabrication are provided by limiting the accumulation of charge on device interconnects during fabrication and by dissipating any accumulated charge in a safe manner. Specifically, a protective semiconductor structure is provided for limiting and dissipating accumulated charge from the conductive interconnects in an NROM memory array. Protective structures are connected to the device interconnects to provide a discharge path for the accumulated charge without adversely affecting the normal operation of the semiconductor device.

The discharge path is provided by a thin insulating layer between a conductive interconnect and the device substrate. In a preferred embodiment of the present invention, the thin insulating layer is formed over a p-well formed in an n-well in the semiconductor substrate. The interconnect to be protected is formed so that a portion of the interconnect overlies the thin insulating layer. The structure forms a capacitor and back-to-back diodes connected in series between the protected interconnect and the substrate, providing a discharge path for built up charge on the interconnect.

BRIEF DESCRIPTION OF THE DRAWINGS

Various advantages of the present invention may be understood by reference to the following detailed description taken in conjunction with the accompanying drawings, in which like characters refer to like parts throughout, and in which.

DETAILED DESCRIPTION OF THE INVENTION

The present invention relates to protecting semiconductor devices, and NROM devices in particular, from induced charge damage during device fabrication. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein, and to be limited only by the appended claims.

Figure 1:
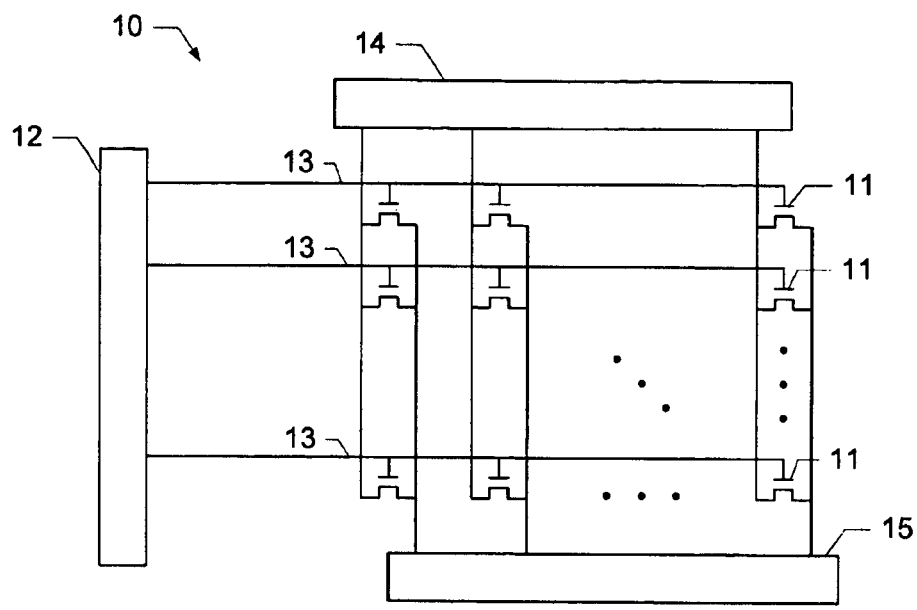
FIG. 1 is a simplified schematic of a portion of a semiconductor memory device.

FIG. 1 is a simplified schematic diagram showing a portion of memory array 10. Memory array 10 includes an array of memory cells organized into rows and columns. Each memory cell typically comprises a stacked gate transistor 1. The control gate of transistors 11 within a row are connected to circuitry 12 by word lines 13. Circuitry 12 decodes address information and drives the corresponding row of memory cells. The sources and drains of transistors 11 are connected, respectively, to circuitry 14 and 15 for biasing the transistors to program or read the memory cells. Circuitry 14 and 15 may also contain sense amplifiers and other circuitry for determining the contents of each memory cell being read.

During device fabrication, induced charges may accumulate on word lines 13 creating a voltage difference across transistors 11 in memory array 10. If the charge becomes large enough transistors 11 may become damaged. The present invention achieves protection against damage caused by process induced electrical charges by providing a discharge path for the accumulated charge. Specifically, a protective structure is created in the semiconductor device that connects to word line 13 to provide a leakage path for charge accumulated during device processing and fabrication.

Figure 2:
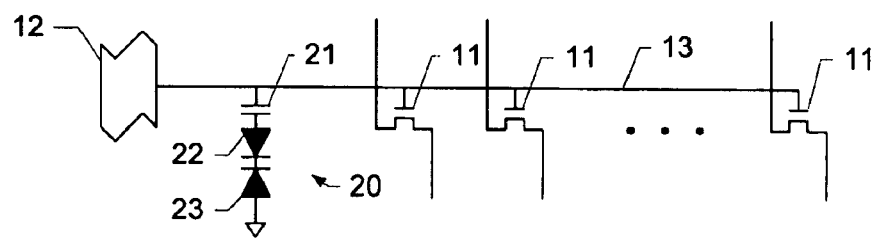
FIG. 2 is a simplified schematic of a portion of a semiconductor memory device incorporating a protective device in accordance with the principles of the present invention.

FIG. 2 is a simplified schematic diagram one row of memory cells of the memory device of FIG. 1 including an equivalent circuit for the protective structure of the present invention. It is to be understood that each of word lines 13 has an attached protective circuit. In addition to word lines 13, other signal lines and devices may be connected to a protective circuit as required to protect a device from induced charges during fabrication and manufacturing.

Protective circuit 20 includes capacitor 21, and back-to-back diodes 22 and 23 connected in series between word line 13 and the device substrate. The circuit is designed so that when the accumulated charge on word line 13 becomes excessive, one of diodes 22 and 23 goes into break down, depending on the polarity of the charge, and current leaks through capacitor 21 and the other one of diodes 22 and 23, thereby dissipating the accumulated charge. During normal circuit operation, the voltage on word line 13 does not get large enough to cause breakdown of diodes 22 and 23 so normal circuit operation is not affected by protective circuit 20.

Figure 3:
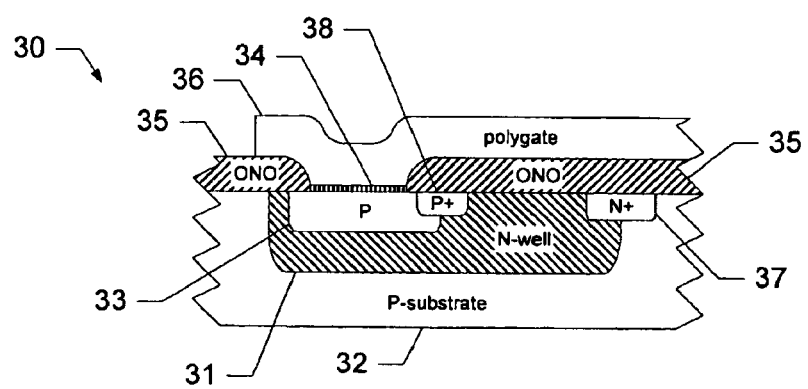
FIG. 3 is a cross-sectional view of a protective structure in accordance with the principles of the present invention.
Figure 4:
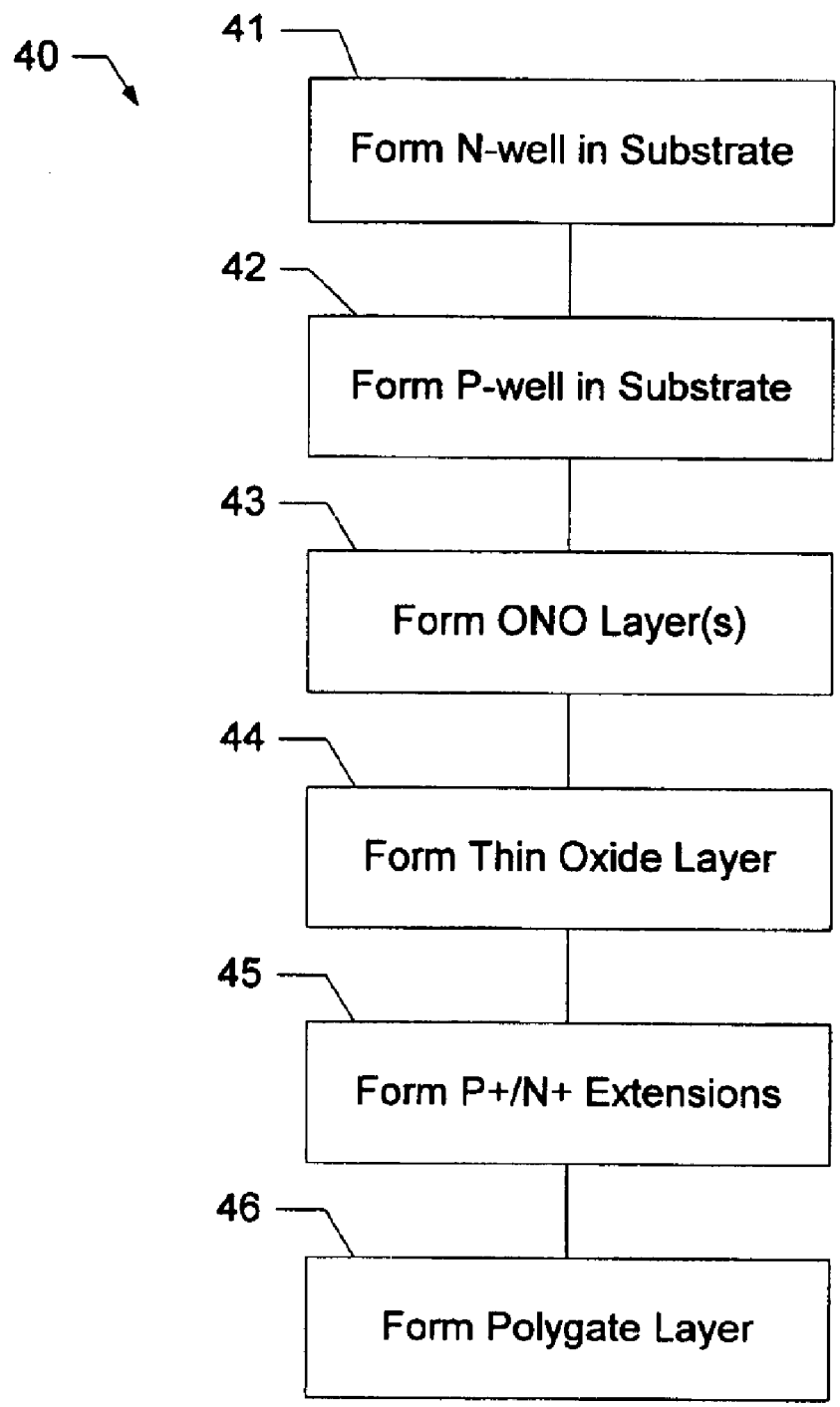
FIG. 4 is a flow diagram for creating a structure to protect a semiconductor device from induced charge damage during device fabrication in accordance with the principles of the present invention.

Referring now to FIGS. 3 and 4 concurrently, fabrication of protective structure 30 is described in accordance with the principles of the present invention. Protective structure 30 is fabricated by creating n-well 31 within p-type substrate 32 near a circuit or signal line to be protected (process step 41). N-well 31 may be created using conventional techniques such as ion implantation or diffusion. P-well 33 is then formed within n-well 31 (process step 42). Preferably, n-well 31 and p-well 33 are formed concurrently with the formation of n-wells and p-wells in other circuit elements.

After formation of n-well 31 and p-well 33, ONO layer 35 is fabricated on the surface of substrate 32 (process step 43). ONO layer 35 is then patterned and etched to create an opening therein adjacent p-well 33. Advantageously, the opening may be created concurrently with fabrication of the gate stacks of the memory cells of memory array 10. As shown in FIG. 3, an opening is created in ONO layer 35 over p-well 33. Thin insulating layer 35 is then formed on p-well 33 in the opening in ONO layer 35 (process step 44). Preferably, thin insulating layer 35 is a thin oxide layer less than about 80 Angstroms in thickness, and preferably less than about 60 Angstroms in thickness. Word lines 13 of FIG. 1 are formed by polygate layer 36 which connects transistors 11 to circuitry 12 (process step 46). Polygate layer 36 is formed on ONO layer 34 and on thin oxide layer 35.

The structure of FIG. 3 corresponds to the protective circuit of FIG. 2. Specifically, thin oxide layer 35 corresponds to capacitor 21; p-well 33 within n-well 31 corresponds to diode 22; and n-well 31 within p-substrate 32 corresponds to diode 23. As described above, each one of word lines 13 is connected to a protection structure as shown in FIG. 3. In addition other circuitry within a semiconductor device may also be connected to a protective structure depending on circuit design.

During subsequent processing of the semiconductor device, charge accumulated on polygate layer 36 builds up a voltage difference between substrate 32 and polygate 36. If the/voltage becomes high enough, the accumulated charge leaks through thin oxide layer 35 and through the back to back PN junctions (e.g., diodes) formed by p-well 33 in n-well 31 in p-type substrate 32. Such leakage protects the ONO layer of the NROM memory cells or other circuit elements from damage.

It should be appreciated that the chosen techniques for NROM formation can vary according to specific design needs, as is well understood in the art, and these variations are within the scope of the present invention when utilized with the provision of a thin oxide layer prior to polygate formation for protection against induced electrical charge.

In addition to the thin oxide layer 34, the present invention further includes utilizing at least one diode with the thin oxide layer 34 to ensure that the NROM device can implement normal operation. In the embodiment shown in FIG. 2, a pair of back-to-back diodes are utilized, as shown by p-well 33 within n-well 31 within p-type substrate 32, as is well appreciated by those skilled in the art. N+well extension 37 and p+well extension 38 (process step 45 of FIG. 4) may be used to adjust the characteristics of diodes 22 and 23 to optimize the protection provided by circuit 20 during fabrication while also isolating protective circuit 20 from other circuitry during normal use. The inclusion of diodes 22 and 23 with thin oxide layer 34 ensures that the capacitive behavior that the thin oxide layer alone would have on the word line is not realized. In this manner, the word line can function at a desired voltage level, thus allowing normal NROM operation. While the use of two diodes is shown, alternate embodiments include the use of one or the other of the diodes 22 and 23, rather than both.

With the present invention, the inclusion of the thin oxide layer achieves protection against process-induced electrical charges before polygate formation. The ability to achieve such protection early in the processing flow of NROM formation reduces the potential for device damage in a straightforward and effective manner. Such reductions in potential damage further aid in improving device production and quality.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method for protecting integrated circuitry from induced charge damage during device fabrication, the method comprising:

forming an ONO layer on a substrate, the ONO layer having an opening therein;

filling the opening with a thin insulating layer; and forming a polysilicon layer on the ONO layer and the thin insulating layer.

2. The method of claim 1 wherein filling the opening with a thin insulating layer comprises providing an oxide layer with a thickness of no more than about eighty Angstroms.

3. The method of claim 2 further wherein the thicknesss of the thin oxide layer is less than about 60 Å.

4. The method of claim 1 further comprising creating an n-well in the substrate prior to forming the ONO layer, where the opening in the ONO layer is over the n-well.

5. The method of claim 4 further comprising forming an n+well at a junction between the substrate and the n-well.

6. The method of claim 4 further comprising creating a p-well within the n-well, wherein the opening in the ONO layer is over the p-well.

7. The method of claim 6 further comprising forming a p+well adjacent the p-well.

8. The method of claim 1 further comprising isolating the thin oxide layer from the substrate with a PN junction.

9. The method of claim 1 further comprising isolating the thin oxide layer from the substrate by a pair of back-to-back PN junctions.

10. The method of claim 9 wherein the PN junctions function as diodes.

11. A structure for protecting NROM devices from charge induced damage during device fabrication, the structure comprising a substrate;

an ONO layer disposed on the substrate, the ONO layer having an opening therein;

a thin insulative layer disposed on the substrate within the opening in the ONO layer; and a polysilicon layer disposed on the ONO layer and on the thin insulative layer the polysilicon layer being coupled to circuitry to be protected.

12. The structure of claim 11 wherein the thin insulative layer comprises a thin oxide layer.

13. The structure of claim 12 wherein the thin oxide layer has a thickness less than about 80 Å.

14. The structure of claim 13 wherein the thin oxide layer has a thickness less than about 60 Å.

15. The structure of claim 12 further comprising a first PN junction between the thin oxide layer and the substrate.

16. The structure of claim 15 wherein the first PN junction comprises an n-well in a p-type substrate.

17. The structure of claim 16 further comprising a second PN junction.

18. The structure of claim 17 wherein the second PN junction comprises a p-well within the n-well.

19. The structure of claim 18 further comprising an n+well at a junction between the n-well and the substrate.

20. The structure of claim 19 further comprising a p+well adjacent to the p-well.

* * * * *